United States Patent
Shiratori et al.

(10) Patent No.: US 9,343,512 B2
(45) Date of Patent: May 17, 2016

(54) LIGHT-EMITTING DEVICE AND ELECTRONIC APPARATUS

(71) Applicant: SEIKO EPSON CORPORATION, Tokyo (JP)

(72) Inventors: Koya Shiratori, Matsumoto (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 167 days.

(21) Appl. No.: 14/327,152

(22) Filed: Jul. 9, 2014

(65) Prior Publication Data
US 2015/0029724 A1 Jan. 29, 2015

(30) Foreign Application Priority Data
Jul. 29, 2013 (JP) .................................. 2013-156414

(51) Int. Cl.
*F21V 9/00* (2015.01)
*H01L 27/32* (2006.01)
*H01L 51/52* (2006.01)

(52) U.S. Cl.
CPC .......... *H01L 27/322* (2013.01); *H01L 51/5265* (2013.01)

(58) Field of Classification Search
CPC .............. H01L 27/322; H01L 51/5265; H01L 27/3211
See application file for complete search history.

(56) References Cited

U.S. PATENT DOCUMENTS

| 5,554,911 A | 9/1996 | Nakayama et al. | |
| 2003/0034938 A1* | 2/2003 | Yamada | H01L 51/5265 345/76 |
| 2006/0091380 A1* | 5/2006 | Yuuki | H01L 27/3211 257/40 |
| 2006/0175966 A1* | 8/2006 | Yamada | H01L 27/322 313/506 |
| 2010/0096617 A1* | 4/2010 | Shanks | C09K 19/2028 257/13 |
| 2012/0099312 A1 | 4/2012 | Yoshioka et al. | |

FOREIGN PATENT DOCUMENTS

| JP | B2-2797883 | 9/1998 |
| JP | A-2011-018554 | 1/2011 |
| JP | A-2012-043810 | 3/2012 |

OTHER PUBLICATIONS

Lee et al., "P-146: Highly Efficient Top Emitting White OLED Architecture for Micro-display Applications," *SID Symposium Digest of Technical Papers*, 2010, pp. 1796-1799, SID.

* cited by examiner

*Primary Examiner* — Evan Dzierzynski
(74) *Attorney, Agent, or Firm* — Oliff PLC

(57) ABSTRACT

A light-emitting device has a resonant structure including a reflection layer, an emitting layer and a semitransmissive reflection layer with the same optical length between the reflection layer and the semitransmissive reflection layer in all of regions from which light is emitted. The light emitting device further includes color filters through which light from the emitting layer having wavelengths of red, green and blue light is extracted, and a notch filter having the lowest transmittance for light having wavelengths in a region between red light and green light and wavelengths in a region between green light and blue light.

9 Claims, 12 Drawing Sheets

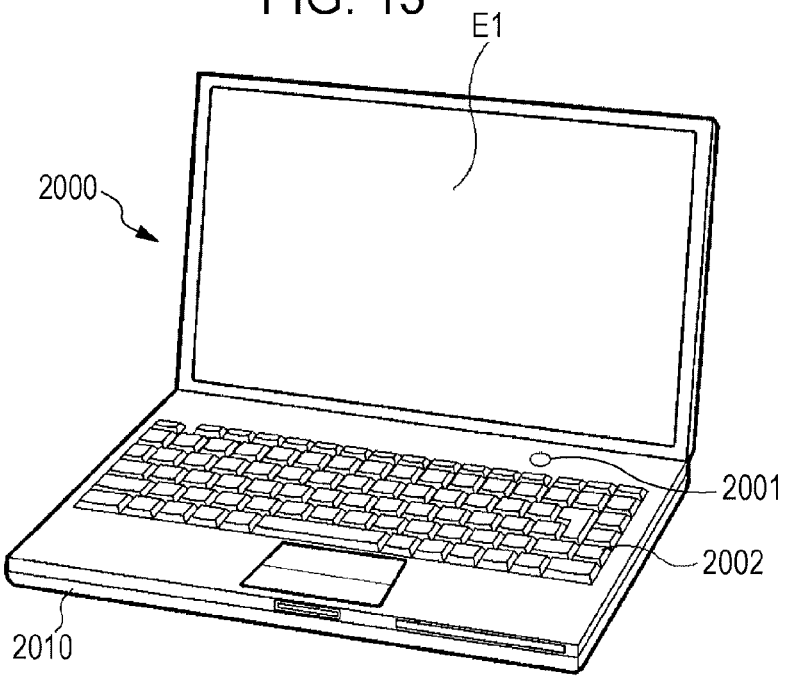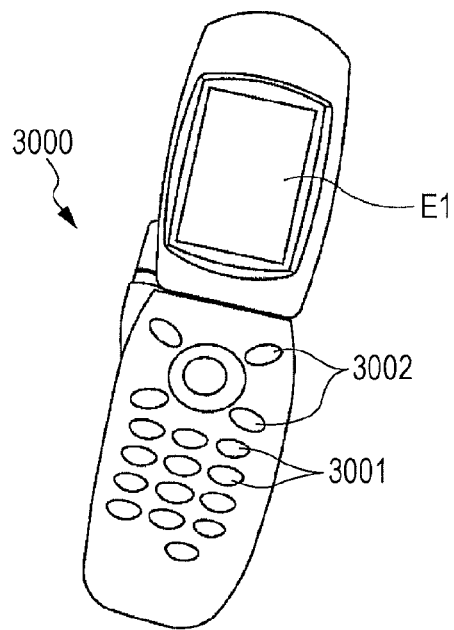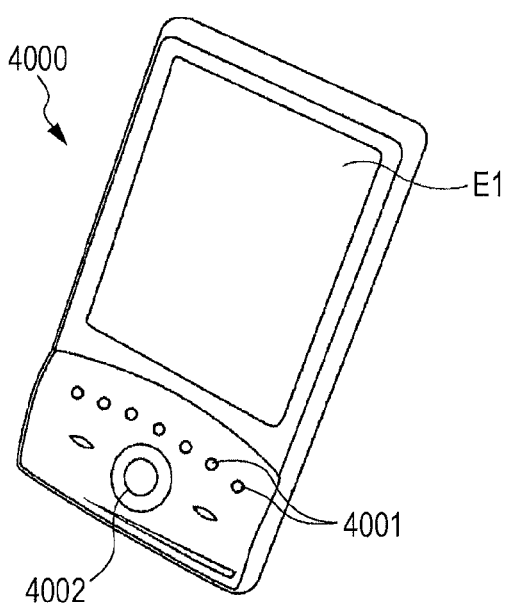

LIGHT-EMITTING DEVICE AND ELECTRONIC APPARATUS

BACKGROUND

1. Technical Field

The present invention relates to a light-emitting device including a light-emitting element and to an electronic apparatus including the light-emitting device.

2. Related Art

Top emission light-emitting devices are often used as display devices or the like of electronic apparatuses. A top emission light-emitting device is a type of light-emitting device from which light emitted from an organic electroluminescent (EL) element on a substrate is extracted to a direction opposite to the substrate. A typical top emission structure includes a light-emitting element between two electrodes, and a reflection layer disposed between a substrate and one of the two electrodes, first electrode (for example, anode), closer to the substrate so that light is extracted through the other electrode or second electrode (for example, cathode). In such a top emission light-emitting device, light is efficiently used.

A technique (for example, SID2010 P-146, S. Lee, Samsung Mobile Display Co., Ltd.) is disclosed of increasing the light extraction efficiency of such a top emission light-emitting device by using a white light-emitting element and allowing light having predetermined wavelengths to resonate between the second electrode and the reflection layer. For this resonant structure, an optical structure satisfying the following equation has been proposed:

$$D=\{(2\pi m+\phi_L+\phi_U)/4\pi\}\lambda \qquad (1)$$

where λ represents the peak wavelength of the resonant structure, D represents the optical length from the reflection layer to the second electrode, $\phi_L$ represents the phase sift of reflection from the first electrode, $\phi_U$ represents the phase shift of reflection from the second electrode, and m represents an integer.

In particular, in the case of m=0, light having a wide range of wavelengths can be extracted with a certain level of efficiency, while the array of organic EL elements is simplified. Accordingly, the cost of the light-emitting device can be reduced, and high-definition pixels can be easily formed.

However, when m is 0, the light-emitting device having an optical structure satisfying equation (1) allows the extraction of light having wavelengths in the all regions of red, green and blue. Accordingly, colors for the red, green and blue pixels are separated through color filters or the like. This causes the band of the emission spectrum to broaden and is accordingly liable to reduce color purity. Also, light extraction efficiency tends to be reduced for each color of the red, green and blue regions. Consequently, the power consumption of the light-emitting device is increased. This is disadvantageous in terms of panel properties.

In order to increase color purity and light extraction efficiency, for example, Japanese Patent No. 2797883 discloses a technique for controlling the optical length D of each of the red, green and blue pixels. Unfortunately, since the optical length D is controlled for each pixel, the technique of the cited patent document results in a complicated pixel structure and increases the number of process steps. In addition, the process for forming high-definition pixels using the technique of this patent document is liable to be limited by the line width of the circuit pattern and results in a reduced aperture ratio. Furthermore, the light-emitting device produced using this technique has a large variation in the thicknesses of the layers from the reflection layer to the semitransmissive reflection layer and accordingly exhibits large changes in chromaticity.

Accordingly, in order to achieve a simple pixel structure capable of reducing the manufacturing cost, to facilitate the production of high-definition small pixels, and to suppress chromaticity changes resulting from the variation in thickness, organic EL elements having an optical structure satisfying equation (1) with m=0 are desired.

The use of color filters having sharp cut-off properties can be a solution for preventing the degradation of color purity in the production of such organic EL elements. In order to achieve sharp cut-off properties, the thickness of color filters is increased. However, in the manufacturing process of a high-definition small display panel, in which fine patters are difficult to from, color filters having sharp cut-off properties are also difficult to form. It is particularly difficult to form such color filters on a sealing layer. Also, materials that can form thick color filters are limited.

SUMMARY

An advantage of some aspects of the invention is that it provides a light-emitting device having a resonant structure using a white organic EL element, including color filters through which colors are separated, and capable of being easily manufactured without reducing color purity even in a manufacturing process of high-definition small display panel.

According to an aspect of the invention, a light-emitting device is provided which includes a resonant structure including a substrate, a reflection layer disposed on the substrate, an emitting layer disposed on the reflection layer, and a semitransmissive reflection layer disposed on the emitting layer. The resonant structure has the same optical length between the reflection layer and the semitransmissive reflection layer in all of regions from which light is emitted. The light-emitting layer also includes color filters which are disposed in a layer different from the reflection layer and through which light from the emitting layer having wavelengths of red, green and blue light is extracted, and a notch filter which is disposed in a layer different from the layer where the color filters are disposed. The notch filter has the lowest transmittance for light having wavelengths in a region between red light and green light and wavelengths in a region between green light and blue light.

In this structure, light emitted from the emitting layer having wavelengths of red, green and blue light is extracted through the color filters, and the notch filter reduces the transmission of light having wavelengths in a region between red light and green light and wavelengths in a region between green light and blue light. Thus, color purity can be increased without increasing the thickness of the color filters. Furthermore, since the thickness of the color filters does not need to be increased, the light-emitting device can be easily reduced in size.

The optical length is expressed by the equation:

$$D=\{(2\pi m+\phi_L+\phi_U)/4\pi\}\lambda \qquad (2)$$

where D represents the optical length, $\phi_L$ represents the phase shift of reflection at the reflection layer, $\phi_U$ represents the phase shift of reflection at the semitransmissive reflection layer, λ represents the peak wavelength of standing waves between the reflection layer and the semitransmissive electrode, and m represents an integer of 2 or less. In an embodiment, the integer m may be 0. When the integer m is 0, the structure from the reflection layer to the semitransmissive reflection layer can be simplified, and the variation in chromaticity is reduced even if the thickness from the reflection layer to the semitransmissive reflection layer has variation.

The light-emitting device may include a light extraction substrate through which light is extracted, and the notch filter includes a first notch filter disposed on the surface, of the light extraction substrate, through which light is extracted and a second notch filter disposed on the surface of the light extraction substrate closer to the emitting layer. These notch filters can easily provide a structure that blocks light having predetermine wavelengths.

The first notch filter and the second notch filer may have different optical properties. In this structure, different notch filters each suppress the transmission of light having different wavelengths. Such a structure can be easily designed and produced.

According to another aspect of the invention, an electronic apparatus including the above-described light-emitting device is provided. The electronic apparatus has a display portion exhibiting high color purity and low variation in chromaticity because of the light-emitting device.

The electronic apparatus may further include an optical member between the surface of the light-emitting device through which light is emitted and the surface of the electronic apparatus on which images are displayed. In this electronic apparatus, the optical member enables the electronic apparatus to satisfactory display an image in such a manner that light reflecting from the light-emitting surface of the light-emitting device is not directly observed, even if the light-emitting surface has high reflectance at specific wavelengths.

BRIEF DESCRIPTION OF THE DRAWINGS

The invention will be described with reference to the accompanying drawings, wherein like numbers reference like elements.

FIG. 13 is a perspective view of a mobile personal computer including a display device using the light-emitting device shown in FIG. 1.

FIG. 14 is a perspective view of a cellular phone including a display device using the light-emitting device shown in FIG. 1.

FIG. 15 is a perspective view of a mobile information terminal device including a display device using the light-emitting device shown in FIG. 1.

DESCRIPTION OF EXEMPLARY EMBODIMENTS

Figure 1:
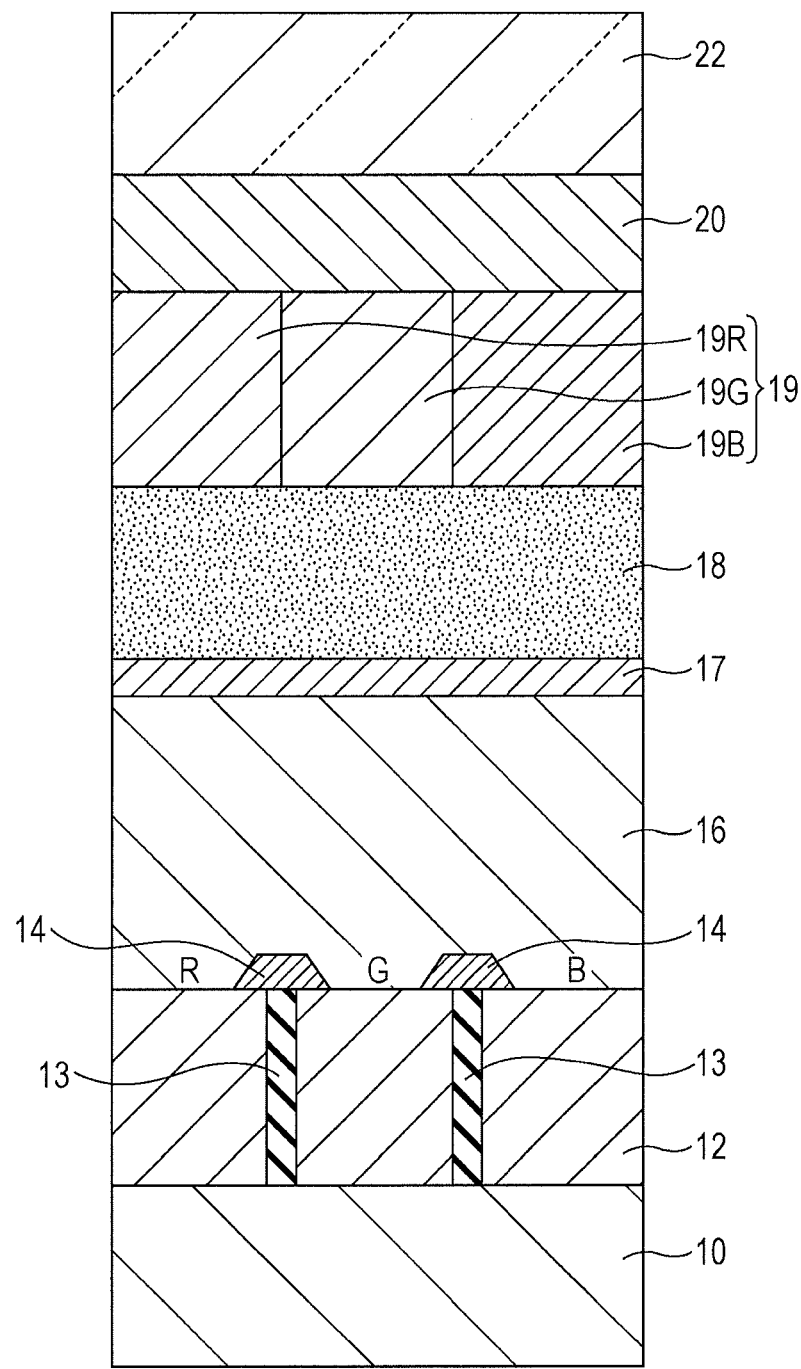
FIG. 1 is a schematic sectional view of a structure of a light-emitting device according to an embodiment of the invention.

An exemplary embodiment of the invention will now be described with reference to the drawings. For the sake of convenience, the dimensional proportions of the components or members may be varied as needed in the drawings.

A: Structure of Light-Emitting Device

FIG. 1 is a schematic sectional view of a structure of a light-emitting device E1 according to an embodiment of the invention. The light-emitting device E1 includes a plurality of light-emitting elements U1 arranged on the surface of a first substrate 10. For the sake of convenience, FIG. 1 shows a part of the divide, including one set of a red (R), a green (G) and a blue (B) light-emitting element U1. The light-emitting device E1 of the embodiment is of top emission type. Light emitted from the light-emitting elements U1 travels in the direction opposite to the first substrate 10. Therefore, the first substrate 10 is not necessarily made of a transparent material such as glass and may be made of an opaque material, such as a ceramic or metal sheet. In the present embodiment, the first substrate 10 has a thickness of 0.5 mm. The first substrate 10 is provided with wiring (not shown) for supplying power to the light-emitting elements U1 to emit light. Also, the first substrate 10 is provided with a circuit (not shown) for supplying power to the light-emitting elements U1.

Each light-emitting element U1 includes a reflective pixel electrode (first electrode) 12 doubling as a reflection layer disposed on the first substrate 10, an opposing electrode (second electrode) 17 overlying the reflective pixel electrode 12, acting as a semitransmissive reflection layer through which light is extracted, and a light-emitting function layer 16 between the reflective pixel electrode 12 and the opposing electrode 17. The light-emitting element U1 further includes a sealing layer 18 disposed on the opposing electrode 17, a color filter 19 disposed on the sealing layer 18, and a notch filter 20 disposed between the color filter 19 and a second substrate 22. Details will be described below.

As shown in FIG. 1, the reflective pixel electrodes 12 doubling as reflection layers are formed on the first substrate 10. The reflective pixel electrodes 12 are made of a light-reflective material. Preferred light-reflective materials include elemental metals, such as Al (aluminum), Ag (silver), Au (gold), and Cu (copper), and alloys mainly containing Au and Cu or Ag. In the present embodiment, the reflective pixel electrodes 12 are made of Al and have a thickness of 80 nm.

The reflective pixel electrodes 12 are separated from each other by insulating films 13 and isolation films 14 for the red (R), green (G) and blue light-emitting elements.

The light-emitting functional layer 16 includes a hole injection layer (HIL) disposed on the reflective pixel electrodes 12, a hole transport layer (HTL) disposed on the hole injection layer, an emitting layer (EML) disposed on the hole transport layer, and an electron transport layer (ETL) disposed on the emitting layer. These layers are not shown in FIG. 1.

The hole injection layer is made of MoOx (molybdenum oxide), and the hole transport layer is made of N,N'-di(1-naphthyl)-N,N'-diphenylbenzidine (α-NPD). In the present embodiment, the thickness of the hole injection layer is 2 nm, and the thickness of the hole transport layer is 25 nm. As an alternative to the hole injection layer and the hole transport layer, a single layer capable of functioning as the hole injection layer and the hole transport layer may be provided.

Figure 2:
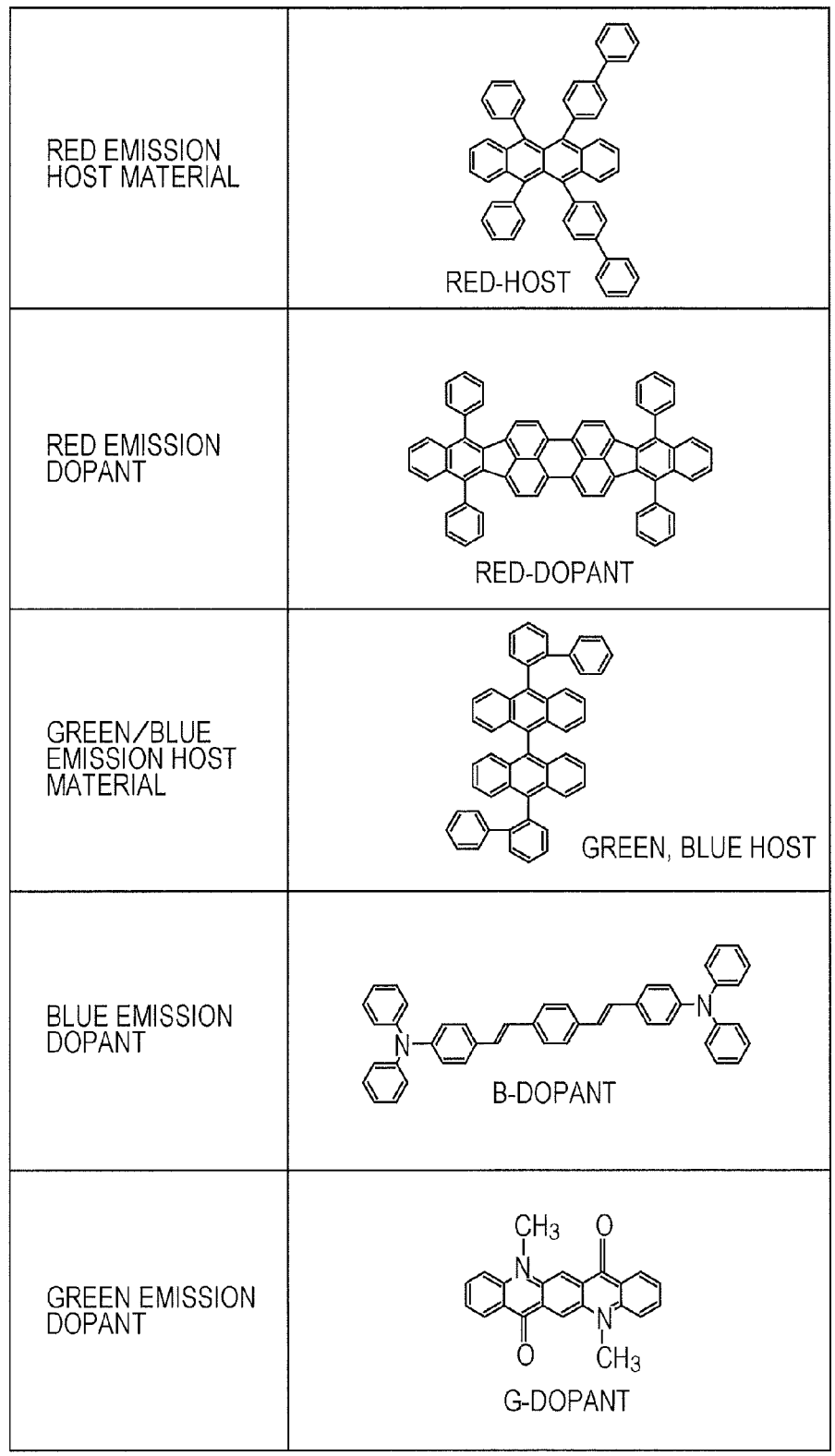
FIG. 2 is a representation of materials of the emitting layer of a light-emitting functional layer.

The emitting layer is made of an organic EL material in which holes and electrons are combined to emit light. In the present embodiment, the organic EL material has a low molecular weight and emits white light. FIG. 2 shows the host material and dopant for red emission and the host material and dopants for green and blue emission. In addition, DPAVBi is used as a dopant for blue emission, and quinacridone is used as a dopant for green emission. In the present embodiment, the thickness of the emitting layer is 50 nm.

The electron transport layer is made of tris(8-quinolinolato) aluminum (Alq3). In the present embodiment, the thickness of the electron transport layer is 25 nm.

The opposing electrode 17 acts as a cathode and is formed so as to cover the light-emitting function layer 16. The opposing electrode 17 is continuously disposed across the plurality of light-emitting elements U1. The opposing electrode 17 functions as a semitransmissive reflection layer that transmits part of the light incident on the surface thereof and reflects the rest of the light (that is, has transreflectivity), and is made of an elementary metal such as magnesium or silver, or an alloy mainly containing magnesium or silver. In the present embodiment, the opposing electrode 17 is made of MgAg (magnesium-silver alloy) and has a thickness of 10 nm.

The opposing electrode 17 is provided with a sealing layer 18 made of an inorganic material thereover to prevent water or external air from permeating the light-emitting elements U1. The inorganic material of the sealing layer 18 is less permeable to gases and may be SiN (silicon nitride) or SiON (silicon oxynitride). In the present embodiment, the sealing layer 18 is made of SiN (silicon nitride) and has a thickness of 400 nm.

In the present embodiment, a second substrate 22 opposes the plurality of light-emitting elements U1 disposed on the first substrate 10. The second substrate 22 is made of a light-transmissive material such as glass and has a thickness of 0.5 mm. The second substrate 22 is provided with color filters 19 and a light-shielding film (not shown) on the surface thereof opposing the first substrate 10. The light-shielding film is a film made of a light-shielding material in which openings are formed corresponding to the light-emitting elements U1. The color filters 19 are formed in the openings.

In the present embodiment, red color filters 19R that selectively transmit red light are formed in the openings corresponding to the red light-emitting elements U1; green color filters 19G that selectively transmit green light are formed in the openings corresponding to the green light-emitting elements U1; and blue color filters 19B that selectively transmit blue light are formed in the openings corresponding to the blue light-emitting elements U1. The color filters 19 have a thickness of 2.0 μm to 2.5 μm.

Figure 3:
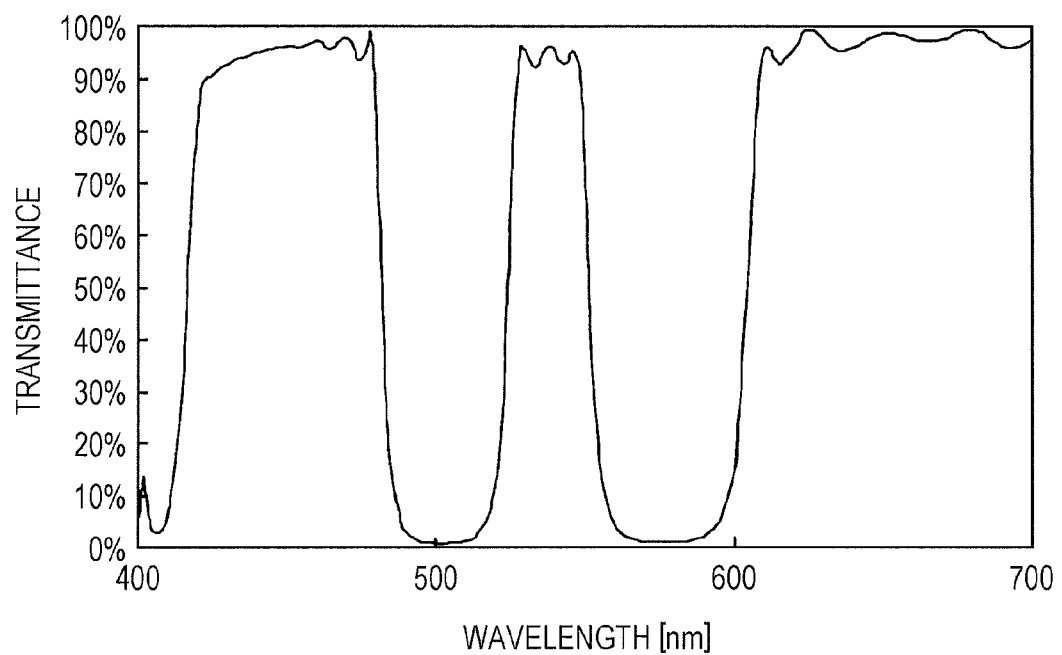
FIG. 3 is a plot of the transmittance of the notch filter with wavelength.

The notch filter 20 is disposed between the color filters 19 and the second substrate 22. In the present embodiment, the notch filter 20 is made of a dielectric multilayer film. The thickness of the notch filter 20 is 1 μl to 10 μm. In the present embodiment, the notch filter 20 is designed so as to block light having wavelengths of 480 nm to 520 nm and 550 nm to 600 nm, that is, light having intermediate wavelengths between red and green and light having intermediate wavelengths between green and blue, as shown in FIG. 3.

Each of the light-emitting elements U1 of the present embodiment has a resonant structure in which light emitted from the light-emitting function layer 16 resonates between the reflective pixel electrode 12 doubling as a reflection layer and the opposing electrode 17 acting as a semitransmissive reflection layer through which light is extracted. This structure enables light having specific wavelengths to be efficiently extracted.

The second substrate 22 having the color filters 19 and light-shielding film and the first substrate 10 are bound together with an adhesive layer (not shown). The sealing layer is made of a transparent resin material, such as epoxy resin or any other curable resin. The structure of the light-emitting device E1 has been described above.

In the light-emitting device E1 of the present embodiment, the resonant structure is defined by setting a predetermined optical length between the reflective pixel electrodes 12 doubling as reflection layers and the opposing electrode 17 acting as a semitransmissive reflection layer through which light is extracted. In this structure, standing waves are produced from the reflective pixel electrodes 12 to the opposing electrode 17.

More specifically, the resonant structure satisfies the following equation:

$$D=\{(2\pi m+\phi_L+\phi_U)/4\pi\}\lambda \tag{3}$$

where D represents the optical length from the surface adjacent to the light-emitting function layer 16 of the reflective pixel electrode 12 to the surface adjacent to the light-emitting function layer 16 of the opposing electrode 17, $\phi_L$ represents the phase shift resulting from reflection at the reflective pixel electrode 12, $\phi_U$ represents the phase shift resulting from reflection at the opposing electrode 30, λ represents the peak wavelength of standing waves, and m represents an integer.

The light-emitting device E1 of the present embodiment has a structure satisfying equation (3) with m=0 from which light rays having wavelengths of all the red, green and blue light are extracted, and in which the light rays are separated into colors through the color filters 19.

B: NTSC Coverage

For the light-emitting device E1 according to the present embodiment having the above structure and light-emitting devices E10 and E11 of Comparative Examples, the NTSC coverages of color filters made of the same material having different thicknesses were measured. The results will now be described.

B-1: Structure of Comparative Example 1

Figure 4:
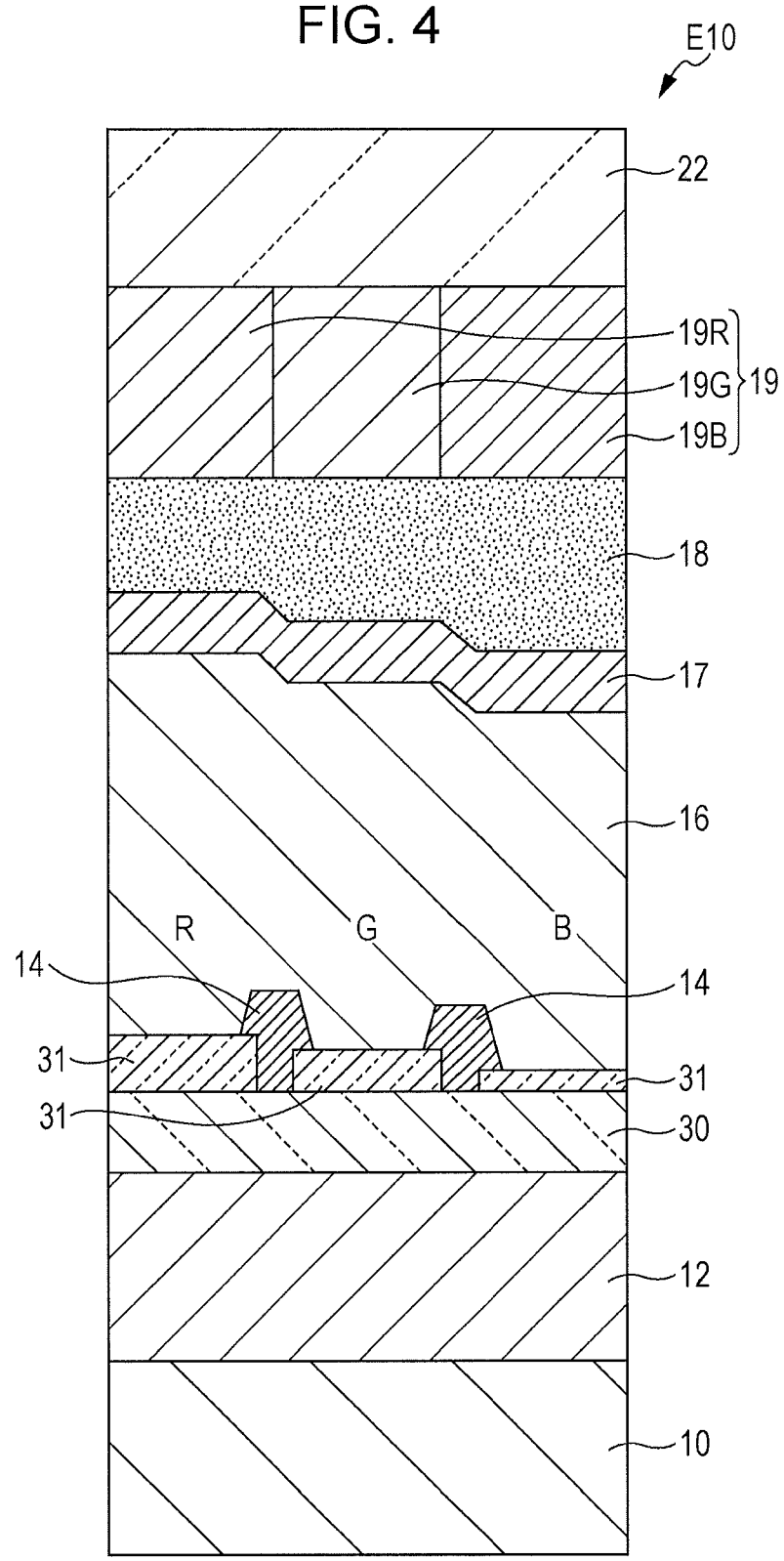
FIG. 4 is a schematic sectional view of the structure of a light-emitting device of Comparative Example 1.

As shown in FIG. 4, the light-emitting device E10 of Comparative Example 1 is different from the light-emitting device E1 of the embodiment in that the reflective pixel electrodes 12 doubling as a reflection layer is replaced with a structure including a reflection layer 12 provided with a transparent layer 30 thereon, and a transparent electrode layer (first electrodes (anodes)) 31 on the transparent layer 30. The light-emitting device E10 of Comparative Example 1 is different from the light-emitting device E1 of the embodiment in that the notch filter 20 is not provided between the second substrate 22 and the color filters 19, as shown in FIG. 4. The same parts as in the light-emitting device E1 of the embodiment are designated by the same reference numerals, and thus description thereof is omitted.

The transparent layer 30 is made of SiO₂ and acts as an optical path adjustment layer. The thickness of the transparent layer 30 is 70 nm. The transparent electrode layer 31 is made of ITO (indium tin oxide). The portions of the transparent electrode layer 31 acting as the transparent electrode of the red light-emitting elements have a thickness of 130 nm; the portions acting as the transparent electrode of the green light-emitting elements have a thickness of 90 nm; and the portions acting as the transparent electrode of the blue light-emitting elements have a thickness of 50 nm. The thicknesses of the light-emitting function layer 16 and the opposing electrode 17 are the same as those of the light-emitting device E1. Specifically, the light-emitting function layer 16 has a thickness of 102 nm, and the opposing electrode 17 has a thickness of 10 nm.

In the light-emitting device E10 of Comparative Example 1, the optical lengths D of the red, green and blue pixels are independently adjusted so as to satisfy equation (3) with m=1.

B-2: Structure of Comparative Example 2

Figure 5:
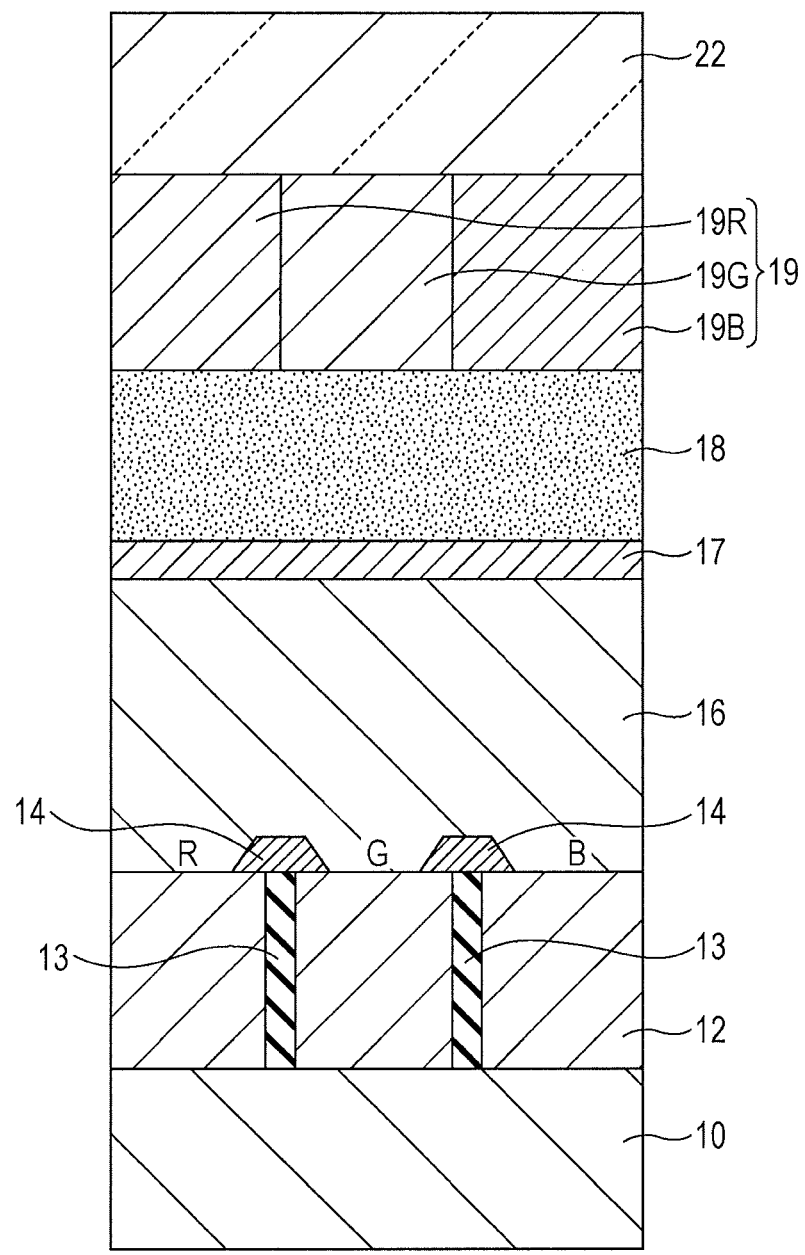
FIG. 5 is a schematic sectional view of the structure of a light-emitting device of Comparative Example 2.

The light-emitting device E11 of Comparative Example 2 is different from the light-emitting device E1 of the embodiment in that the notch filter 20 is not provided between the second substrate 22 and the color filters 19, as shown in FIG. 5. The same parts as in the light-emitting device E1 of the embodiment are designated by the same reference numerals, and thus description thereof is omitted. More specifically, the light-emitting device E11 of Comparative Example 2 has a structure satisfying equation (3) with m=0 from which light rays having wavelengths of all the red, green and blue light are extracted, and in which the light rays are separated into colors through the color filters 19.

B-3: Comparison of NTSC Coverages

Figure 6:
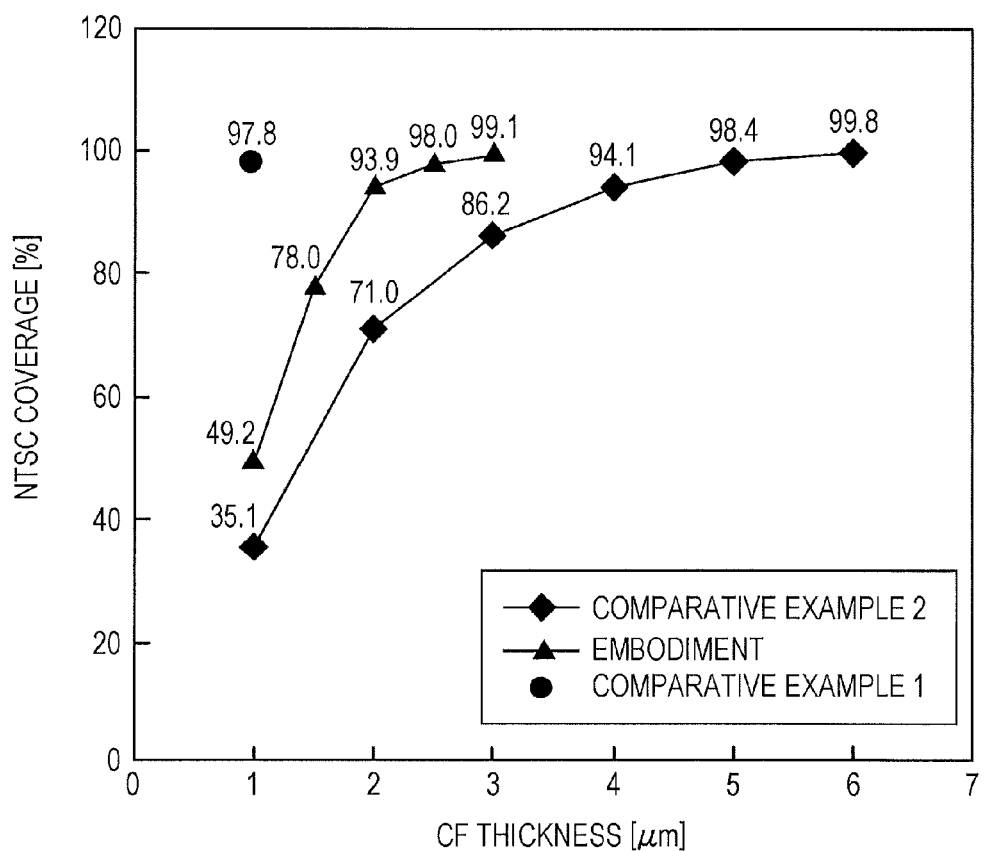
FIG. 6 is a plot showing the relationship between the color filter thickness and the NTSC coverage of the light-emitting devices of an embodiment and Comparative Examples 1 and 2.

FIG. 6 shows the NTSC coverages of the light-emitting device E1 of the embodiment and the light-emitting devices E10 and E11 of Comparative Examples 1 and 2. As shown in FIG. 6, the light-emitting device E10 of Comparative Example 1 exhibits an NTSC coverage of 97.8%, or nearly 100%, even when the color filters 19 have a thickness of 1 μm.

In the case of Comparative Example 2, in order for the light-emitting device E11 to yield a NTSC coverage close to the NTSC coverage of the light-emitting device E10 of Comparative Example 1, the thickness of the color filters 19 must be increased to about 5 μm.

On the other hand, the light-emitting device E1 of the embodiment exhibits almost the same NTSC coverage as the light-emitting device E10 of Comparative Example 1 even when the thickness of the color filters 19 is 2.0 μm to 2.5 μm.

Since the color filters 19 of the light-emitting device E1 of the embodiment can be as thin as above, the light-emitting device E1 of the embodiment can be used in a high-definition small display panel including pixels whose short side is, for example, about 1 to 20 μm in length, manufactured in a process in which fine patterning is difficult. In addition, since the thickness of the color filters 19 can be thin as described above, the color filters 19 have more choices of materials.

C: Comparison of Variation in Chromaticity

Figure 7:
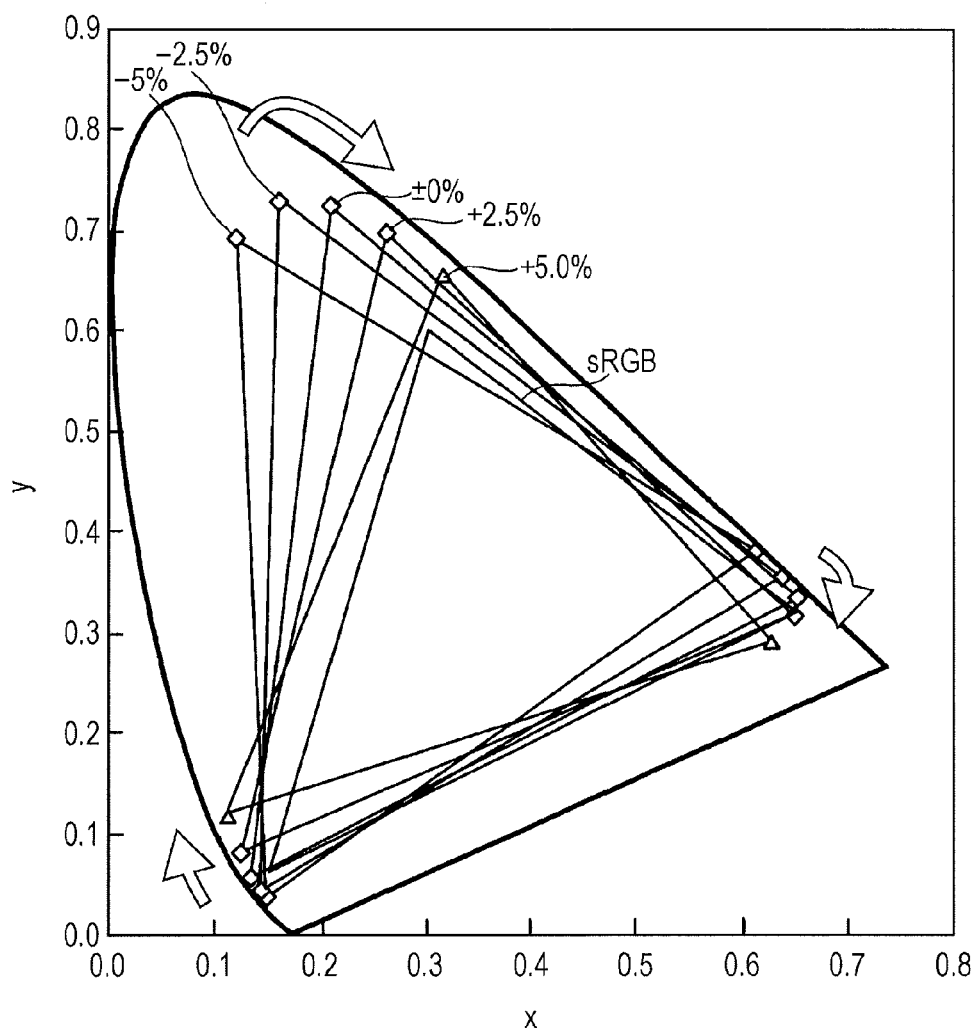
FIG. 7 is a plot of the variation in chromaticity when the thickness of the light-emitting device of Comparative Example 1 from the reflection layer to the opposing electrode is varied from −5.0% to +5.0%.
Figure 8:
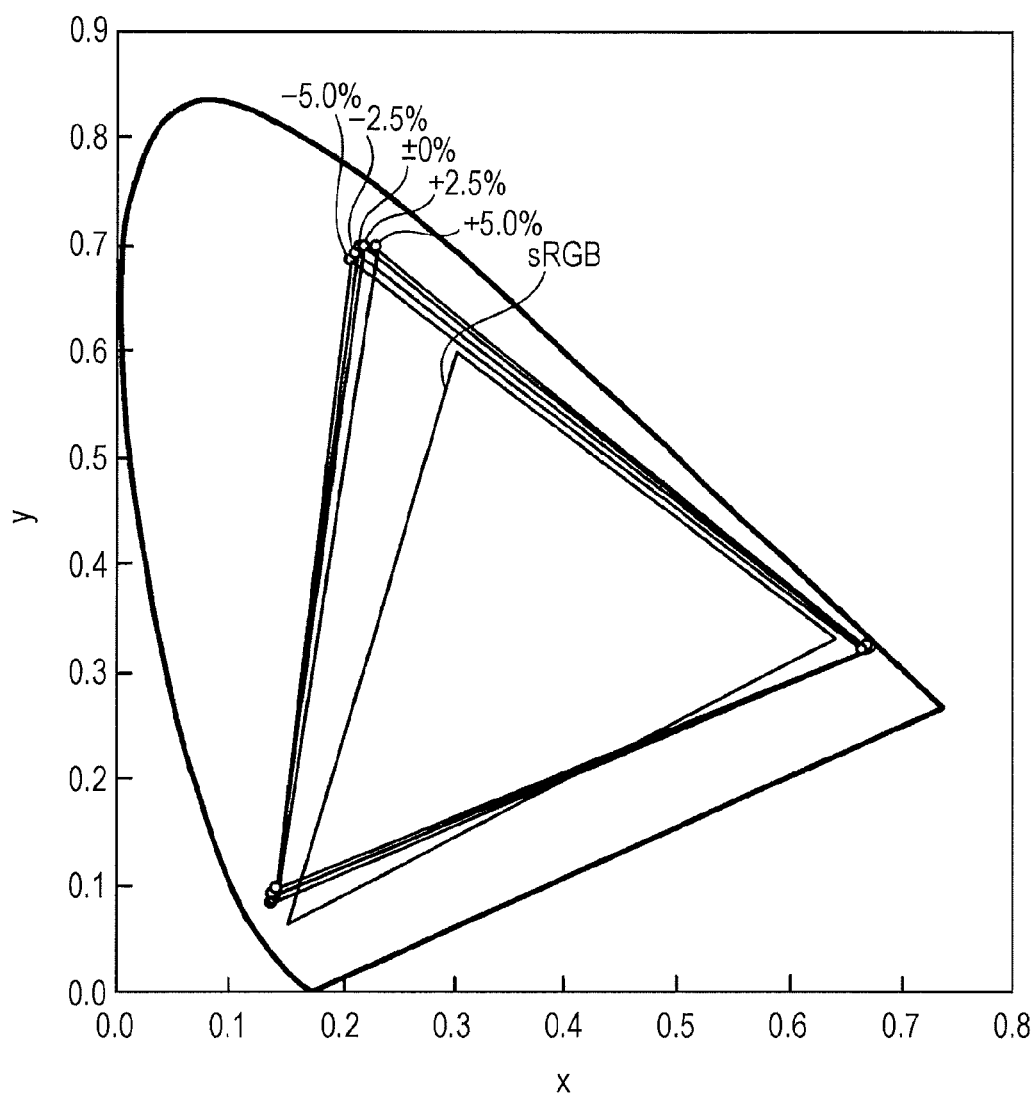
FIG. 8 is a plot of the variation in chromaticity when the thickness of the light-emitting device of an embodiment from a reflective pixel electrode doubling as a reflection layer to the opposing electrode is varied from −5.0% to +5.0%.

The variations in chromaticity of the light-emitting devices E1 and E10 of the embodiment and Comparative Example 1 were compared. The results are described below. FIG. 7 is a plot showing the variation in chromaticity of the light-emitting device E10 of Comparative Example 1. FIG. 8 is a plot showing the variation in chromaticity of the light-emitting device E1 of the embodiment. Each of FIGS. 7 and 8 shows the calculation results of changes in chromaticity when the thickness from the reflection layers 12 to the opposing electrode 17 is varied from −5.0% to +5.0%. The calculation was conducted assuming that the transmittances of the color filters 19 and the notch filter 20 do not vary. Since the notch filter 20 can be formed in an apparatus for forming optical filters, which can easily form films with a smaller variation in thickness than an apparatus for forming the layers from the reflection layer 12 to the opposing electrode 17. Accordingly, transmittance was assumed not to vary.

As indicated by the arrows in FIG. 7 showing the case of the light-emitting device E10 of Comparative Example 1, the triangular region shifts clockwise as the thickness from the reflection layer 12 to the opposing electrode 17 is increased. On the other hand, in the case of the light-emitting device E1 of the embodiment, the triangular region does not substantially change even though the thickness varies from −5.0% to +5.0%, as shown in FIG. 8. This suggests that the variation in chromaticity is small. It is therefore believed that the structure of the light-emitting device E1 of the embodiment is effective in enhancing quality assurance and increasing the yield of the product.

D: Modifications

The invention is not limited to the above-described embodiment, and various modifications may be made as described below. The following modifications and the embodiment may be combined as needed.

(1) Modification 1

Figure 9:
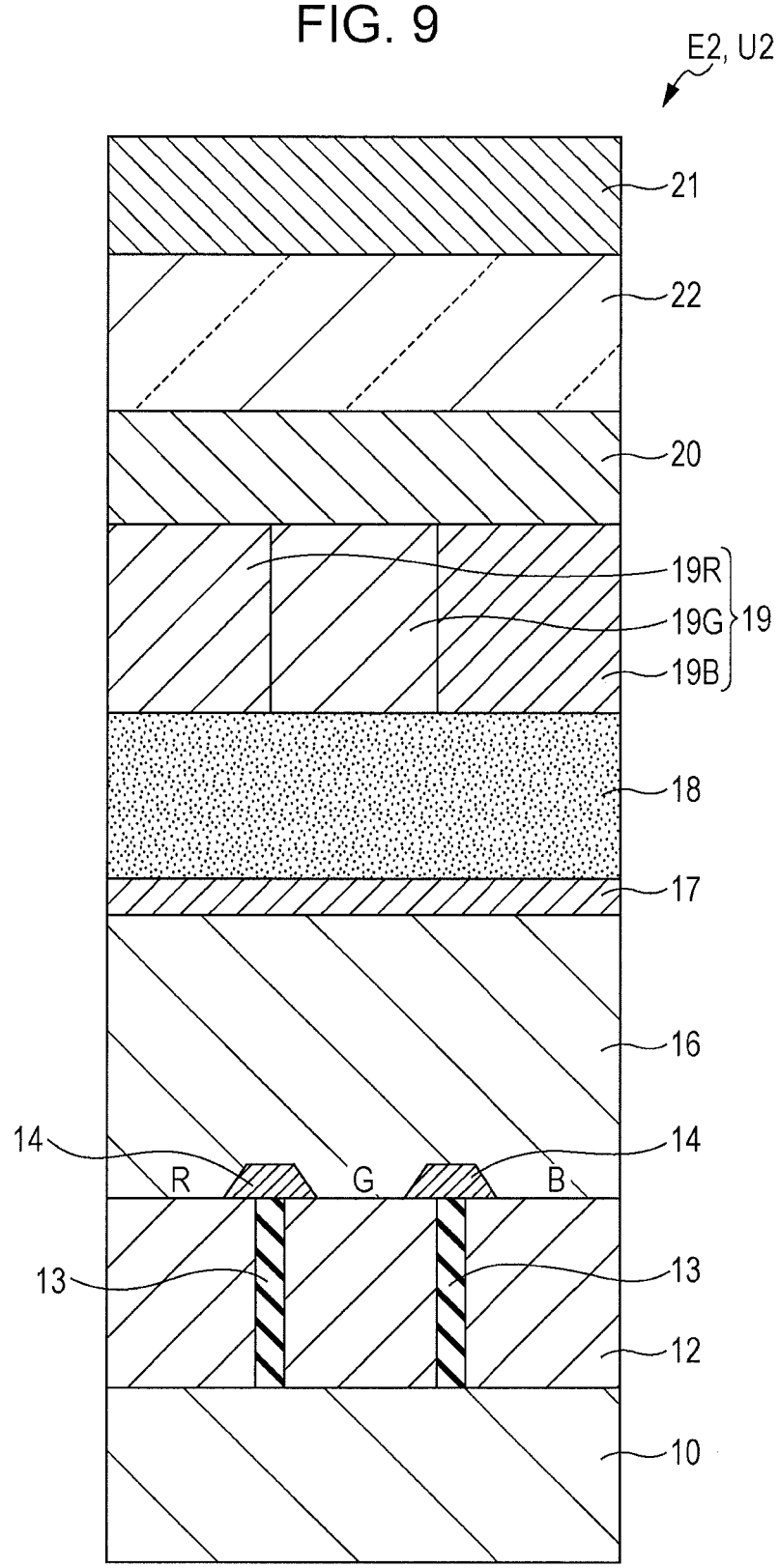
FIG. 9 is a schematic sectional view of a structure of a light-emitting device of a modification of an embodiment of the invention.

The above-described embodiment has illustrated a structure in which a notch filter 20 is disposed between the second substrate 22 and the color filters 19. However, the invention is not limited to this structure. FIG. 9 shows a light-emitting device E2 of a modification (Modification 1) of the embodiment. The light-emitting device E2 includes a plurality of light-emitting elements U2 arranged on the surface of a first substrate 10. For the sake of convenience, FIG. 9 shows a part of the divide, including one set of a red (R), a green (G) and a blue (B) light-emitting element U1. In the light-emitting device E2, notch filters 20 and 21 are disposed at both sides of the second substrate 22, as shown in FIG. 9. The notch filters 20 and 21 have different optical properties. For example, notch filter 20 blocks light between red and green, and notch filter 21 blocks light between green and blue. This structure allows easy design and manufacture of notch filters.

(2) Modification 2

The above-described embodiment has illustrated a structure in which the reflective pixel electrodes 12 of the light-emitting elements are made of Al. However, the invention is not limited to this structure. For example, the reflective pixel electrode 12 of the red light-emitting element may be made of Ag, Au or Cu, while the reflective pixel electrodes 12 of the green and blue light-emitting elements may be made of Al.

Equation (3) is converted into equation (4):

$$\lambda = 4D\pi/(2\pi m + \phi_L + \phi_U) \quad (4)$$

This suggests that when the phase shift at a reflection interface is small, the peak wavelength of standing waves shifts to a longer wavelength even with a constant thickness. In particular, when m is 0, the following equation (5) holds true:

$$\lambda = 4D\pi/(\phi_L + \phi_U) \quad (5)$$

Thus the phase shift at a reflection interface increases.

A phase shift is expressed by the following equation (6):

$$\phi = \tan^{-1}\{2n_1 k_2/(n_1^2 - n_2^2 - k_2^2)\} \quad (6)$$

where $\phi$ (rad) represents the amount of a phase shift, $n_1$ represents the refractive index of the light-emitting function layer 16, $n_2$ represents the refractive index of the opposing electrode 17, and $k_2$ represents the extinction coefficient of the opposing electrode 17. From the results of calculation for the amounts of phase shifts at exemplary metals Al, Cu, Au and Ag, assuming that the refractive index $n_1$ of the light-emitting function layer 16 is 1.8, it has been found that the phase shift in the case using Cu, Au or Ag is smaller than the case using Al.

A simulation teaches that the use of reflective pixel electrodes 12 made of Cu, Au or Ag, which has exhibited a smaller phase shift, more increases light extraction efficiency in a longer wavelength region of 600 nm or more than the case using Al.

Therefore, it is effective in increasing the light extraction efficiency of red light, which has wavelengths of 600 nm or more, to form the reflective pixel electrode 12 of the red light-emitting element of a metal that exhibits a small phase shift, such as Cu, Au, or Ag. For the light-emitting elements that emit green light, which has wavelengths of 520 nm to 560 nm, or blue light, which has wavelengths of 450 nm to 470 nm, the reflective pixel electrodes may be formed of Al. Thus, even in the light-emitting device E1 having an optical structure satisfying equation (3) with m=0, red light can be more efficiently extracted, and power consumption can be significantly reduced.

(3) Modification 3

The above-described embodiment has illustrated a top emission light-emitting device from which light is extracted through the second substrate 22. However, the invention is not limited to this structure. For example, the feature of the invention may be applied to a bottom emission light-emitting device from which light is extracted through the first substrate 10.

(4) Modification 4

The above-described embodiments has illustrated a structure in which the pixel electrodes 12 double as reflection layers. However, the invention is not limited to this structure. For example, the reflective pixel electrodes may be replaced with a structure including pixel electrodes made of transparent electroconductive material and reflection layers provided between the pixel electrodes and the first substrate, as long as the m value of equation (1) is 0.

E: Applications

The light-emitting device of an embodiment of the invention may be applied to various types of electronic apparatuses. Exemplary applications will be described below.

(1) Application 1

Figure 10:
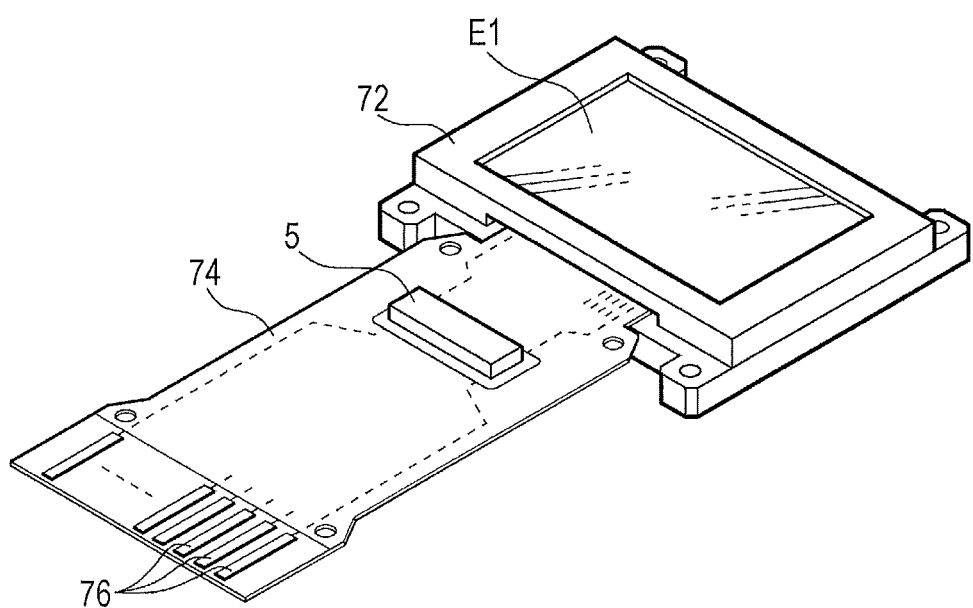
FIG. 10 is a perspective view of a micro-display according to an application of the invention.

FIG. 10 is a perspective view of a microdisplay of a head-mounted display using the light-emitting device E1 of the above-described embodiment, on which images are displayed. The light-emitting device E1 is inset in a frame-shaped case 72 having an opening at the display portion, and one end of a flexible printed circuit (FPC) substrate 74 is connected to the light-emitting device E1. The FPC substrate 74 includes a control circuit 5 of semiconductor chips mounted thereon by a chip on film (COF) technique. The control circuit 5 has a plurality of terminals 76 connected to a higher-order circuit (not shown). Image data is transmitted from the higher-order circuit through the plurality of terminals 76 in synchronization with synchronizing signals. The synchronizing signals include a vertical synchronizing signal, a horizontal synchronizing signal, and a dot clock signal. The image data specifies a gradation level of a pixel at 8 bits.

The control circuit 5 functions both as a power supply circuit and a data signal output circuit of the light-emitting device E1. More specifically, the control circuit 5 supplies control signals or potentials generated in synchronization with synchronizing signals to the light-emitting device E1 and, in addition, converts digital image data into analogue data and transmits the analogue data to the light-emitting device E1.

Figure 11:
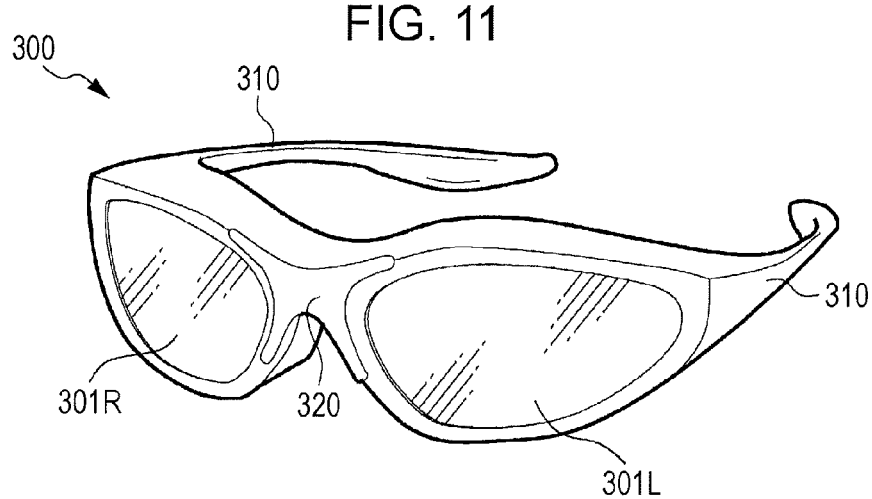
FIG. 11 is a perspective view of a head-mounted display according to an application of the invention.

FIG. 11 shows the appearance of a head-mounted display 300 having the optical structure shown in FIG. 9. As shown in FIG. 11, the head-mounted display 300 includes temples 310, a bridge 320 and lenses 301L and 301R in appearance, as with general eyeglasses. Also, the head-mounted display 300 further includes a left-eye light-emitting device E1L and a right-eye light-emitting device E1R near the bridge 320, at the back of the lenses 301L and 301R (lower side of the figure), as shown in FIG. 12.

Figure 12:
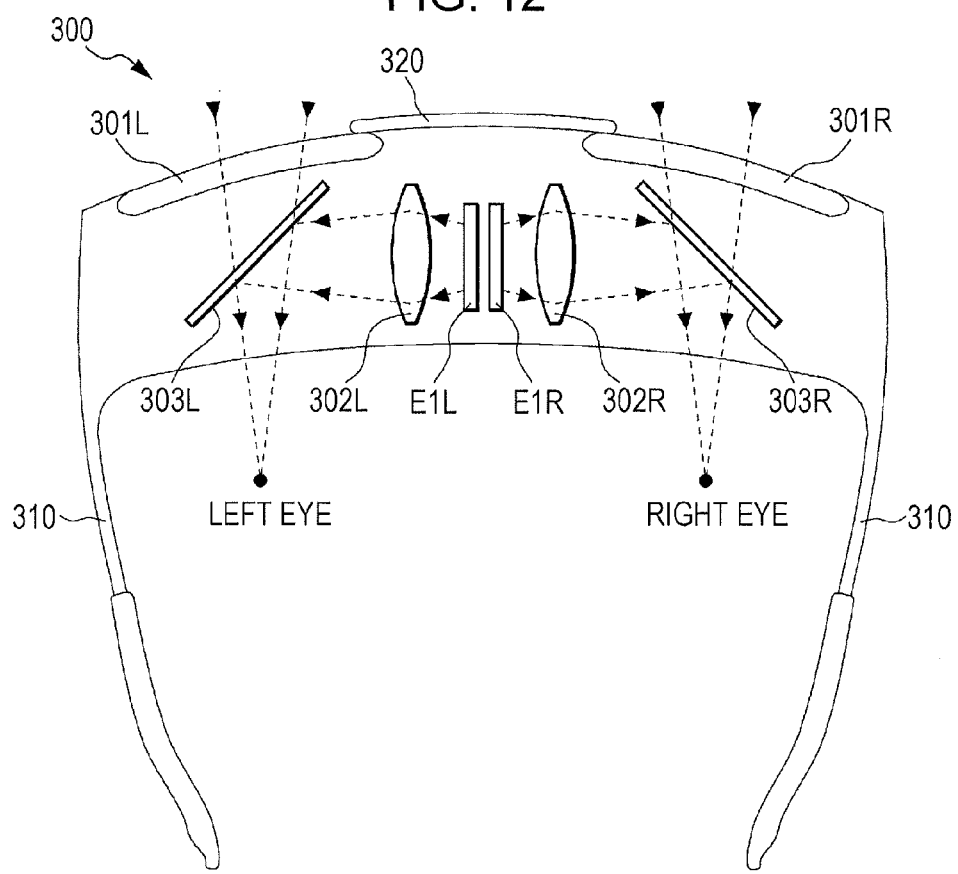
FIG. 12 is a perspective view of the optical structure of the head-mounted display.

The left-eye light-emitting device E1L has an image display face on the left side thereof in FIG. 12. Thus, an image displayed on the left-eye light-emitting device E1L is emitted in the direction of 9 o'clock through an optical lens 302L. A half mirror 303L reflects the image emitted from the left-eye light-emitting device E1L in the direction of 6 o'clock and also transmits light coming from the direction of 12 o'clock.

The right-eye light-emitting device E1R has an image display face on the right side thereof opposite to the case of the left-eye light-emitting device E1L. Thus, an image displayed on the right-eye light-emitting device E1R is emitted in the direction of 3 o'clock through an optical lens 302R. A half mirror 303R reflects the image emitted from the right-eye light-emitting device E1R in the direction of 6 o'clock and also transmits light coming from the direction of 12 o'clock.

This structure enables the user wearing the head-mounted display 300 to see an image displayed by the light-emitting devices E1L and E1R in a see-through state over the real view. If the head-mounted display 300 is configured so that the left-eye light-emitting device E1L displays the left-eye image of a set of binocular images having a parallax while the right-eye light-emitting device E1R displays the right-eye image, the user wearing this head-mounted display 300 can see a three-dimensional image (3D image) as if it had a depth.

In particular, the notch filter 20 of the light-emitting device E1 has the characteristics of transmittance as shown in FIG. 3, and hence exhibits reversed reflectance characteristics. More specifically, the reflectance increases for light having wavelengths of 480 nm to 520 nm and 550 nm to 600 nm, that is, light having intermediate wavelengths between red and green and light having intermediate wavelengths between green and blue. Consequently, when the light-emitting device E1 is directly viewed, shades of color may be observed. In the head-mounted display 300, however, the light-emitting devices E1 can be advantageously used because they are not viewed directly. In addition, since the light-emitting device E1 can be reduced in size and the definition thereof can be increased, the light-emitting device E1 can be suitably applied to small electronic apparatuses such as the head-mounted display 300.

The light-emitting device E1 can also be used in, for example, viewfinders of video cameras and lens-interchangeable digital cameras, in addition to the head-mounted display 300.

(2) Application 2

FIG. 13 is a perspective view of a mobile personal computer using the light-emitting device E1 of the above-described embodiment as a display device. The personal computer 2000 includes the light-emitting device E1 as a display device, and a body 2010. The body 2010 includes a power switch 2001 and a key board 2002. The light-emitting device E1 includes organic EL elements, and accordingly can provide a wide-view-angle display easy to see.

FIG. 14 shows a cellular phone including the light-emitting device E1 of the above-described embodiment. The cellular phone 3000 includes a plurality of control buttons 3001 and scroll buttons 3002, and the light-emitting device E1 as a display device. By operating the scroll buttons 3002, images displayed on the light-emitting device E1 is scrolled.

FIG. 15 shows a mobile information terminal device, such as a personal digital assistant (PDA) or a smartphone, including the light-emitting device E1 of the above-described embodiment. The mobile information terminal device 4000 includes a plurality of control buttons 4001, a power switch 4002, and the light-emitting device E1 as a display device. On pressing the power switch 4002, various types of information, such as addresses and schedules, are displayed on the light-emitting device E1.

In addition to the apparatuses shown in FIGS. 13 to 15, the light-emitting device can be used in other electronic apparatuses including digital still cameras, TV sets, video cameras, car navigation systems, pagers, electronic notebooks, electronic papers, electronic calculators, word processors, work stations, videophones, POS terminals, printers, scanners, copy machines, video players, and other touch panel-equipped apparatuses.

The entire disclosure of Japanese Patent Application No. 2013-156414, filed Jul. 29, 2013 is expressly incorporated by reference herein.

What is claimed is:

1. A light-emitting device comprising:
   a resonant structure including a reflection layer, an emitting layer overlying the reflection layer, and a semitransmissive reflection layer overlying the emitting layer, the resonant structure having the same optical length between the reflection layer and the semitransmissive reflection layer in all of regions from which light is emitted;
   color filters through which light from the emitting layer having wavelengths of red, green and blue light is extracted; and
   a notch filter having the lowest transmittance for light having wavelengths in a region between red light and green light and wavelengths in a region between green light and blue light.

2. The light-emitting device according to claim 1, wherein the optical length is expressed by the equation:

$$D=\{(2\pi m+\phi_L+\phi_U)/4\pi\}\lambda,$$

wherein D represents the optical length, $\phi_L$ represents the phase shift of refection from the reflection layer, $\phi_U$ represents the phase shift of reflection from the semitransmissive reflection layer, $\lambda$ represents the peak wavelength of a standing waves between the reflection layer and the semitransmissive reflection layer, and m represents an integer of 2 or less, and wherein the integer m is 0.

3. An electronic apparatus comprising the light-emitting device as set forth in claim 2.

4. The light-emitting device according to claim 1, further comprising a light extraction substrate through which light is extracted, wherein the notch filter includes a first notch filter disposed on the surface, of the light extraction substrate, through which light is extracted and a second notch filter disposed on the surface of the light extraction substrate closer to the emitting layer.

5. The light-emitting device according to claim 4, wherein the first notch filter and the second notch filter have different optical properties.

6. An electronic apparatus comprising the light-emitting device as set forth in claim 5.

7. An electronic apparatus comprising the light-emitting device as set forth in claim 4.

8. An electronic apparatus comprising the light-emitting device as set forth in claim 1.

9. The electronic apparatus according to claim 8, further comprising an optical member between a surface of the light-emitting device through which light is emitted and a surface of the electronic apparatus on which images are displayed.

* * * * *